United States Patent
Lo et al.

(10) Patent No.: US 6,201,383 B1
(45) Date of Patent: Mar. 13, 2001

(54) METHOD AND APPARATUS FOR DETERMINING SHORT CIRCUIT CONDITIONS USING A GANG PROBE CIRCUIT TESTER

(75) Inventors: Jiann-Chang Lo, San Jose, CA (US); James Christopher Mahlbacher, Lake Worth, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/010,910

(22) Filed: Jan. 22, 1998

(51) Int. Cl.⁷ ..................................... G01R 19/00
(52) U.S. Cl. ..................... 324/73.1; 324/66; 324/540
(58) Field of Search .................... 714/744, 734, 714/736; 324/73.1, 537, 555, 66, 540

(56) References Cited

U.S. PATENT DOCUMENTS

| | | | |
|---|---|---|---|
| 4,290,013 | * | 9/1981 | Thiel .................................. 324/73.1 |
| 4,342,959 | * | 8/1982 | Skilling ............................... 324/73.1 |
| 4,348,759 | | 9/1982 | Schnurmann . |
| 4,471,298 | | 9/1984 | Frohlich . |
| 5,485,081 | | 1/1996 | Whitehead . |

FOREIGN PATENT DOCUMENTS

0008568 * 1/1981 (JP) ........................................ 324/66

* cited by examiner

*Primary Examiner*—Safet Metjahic
(74) *Attorney, Agent, or Firm*—Ronald V. Davidge; Richard A. Tomlin

(57) ABSTRACT

A method for determining whether short circuits exist among networks within a circuit under test includes bringing test probes into contact with each such network and switching groups of the test probes among two sides of a test circuit so that current flows through the testing circuit only when one of the test probes connected to one side of the testing circuit is connected by means of a short circuit to one of the test probes connected to the other side of the test circuit. This first test process establishes the fact that a short circuit exists without determining which networks are connected by the short circuit. A version of this method subsequently applies tests to individual networks to make this determination, in the event that a short circuit is found to exist by the first test process. Other versions of this method additionally determine which networks are connected to which other networks by short circuits.

26 Claims, 7 Drawing Sheets

| CHANNEL | TEST | | | |
|---|---|---|---|---|
| | 1 | 2 | 3 | 4 |
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |

FIG. 2.

| CHANNEL | TEST | | | |
|---|---|---|---|---|
| | 1 | 2 | 3 | 4 |
| 0 | 0 | 0 | 0 | 0 |
| 1 | 0 | 0 | 0 | 1 |
| 3 | 0 | 0 | 1 | 1 |
| 6 | 0 | 1 | 1 | 0 |
| 7 | 0 | 1 | 1 | 1 |
| 8 | 1 | 0 | 0 | 0 |
| 10 | 1 | 0 | 1 | 0 |
| 11 | 1 | 0 | 1 | 1 |
| 13 | 1 | 1 | 0 | 1 |
| 15 | 1 | 1 | 1 | 1 |

FIG. 3.

|  | METHOD | | |
| --- | --- | --- | --- |
| NUMBER OF CHANNELS | 1 | 2 | 3 |
| 1 |  |  |  |
| 2 | 1 | 1 | 1 |
| 3 | 3 | 2 | 2 |
| 4 | 6 | 3 | 2 |
| 5 | 10 | 4 | 3 |
| 6 | 15 | 5 | 3 |
| 7 | 21 | 6 | 3 |
| 8 | 28 | 7 | 3 |
| 9 | 36 | 8 | 4 |
| 10 | 45 | 9 | 4 |
| 11 | 55 | 10 | 4 |
| 12 | 66 | 11 | 4 |
| 13 | 78 | 12 | 4 |
| 14 | 91 | 13 | 4 |
| 15 | 105 | 14 | 4 |
| 16 | 120 | 15 | 4 |
| 17 | 136 | 16 | 5 |
| 18 | 153 | 17 | 5 |
| 19 | 171 | 18 | 5 |
| 20 | 190 | 19 | 5 |
| 21 | 210 | 20 | 5 |
| 22 | 231 | 21 | 5 |
| 23 | 253 | 22 | 5 |
| 24 | 276 | 23 | 5 |
| 25 | 300 | 24 | 5 |
| 26 | 325 | 25 | 5 |
| 27 | 351 | 26 | 5 |
| 28 | 378 | 27 | 5 |
| 29 | 406 | 28 | 5 |
| 30 | 435 | 29 | 5 |
| 31 | 465 | 30 | 5 |
| 32 | 496 | 31 | 5 |
| 33 | 528 | 32 | 6 |
| 34 | 561 | 33 | 6 |
| 35 | 595 | 34 | 6 |

|  | METHOD | | |
| --- | --- | --- | --- |
| NUMBER OF CHANNELS | 1 | 2 | 3 |
| 36 | 630 | 35 | 6 |
| 37 | 666 | 36 | 6 |
| 38 | 703 | 37 | 6 |
| 39 | 741 | 38 | 6 |
| 40 | 780 | 39 | 6 |
| 41 | 820 | 40 | 6 |
| 42 | 861 | 41 | 6 |
| 43 | 903 | 42 | 6 |
| 44 | 946 | 43 | 6 |
| 45 | 990 | 44 | 6 |
| 46 | 1035 | 45 | 6 |
| 47 | 1081 | 46 | 6 |
| 48 | 1128 | 47 | 6 |
| 49 | 1176 | 48 | 6 |
| 50 | 1225 | 49 | 6 |
| 51 | 1275 | 50 | 6 |
| 52 | 1326 | 51 | 6 |
| 53 | 1378 | 52 | 6 |
| 54 | 1431 | 53 | 6 |
| 55 | 1485 | 54 | 6 |
| 56 | 1540 | 55 | 6 |
| 57 | 1596 | 56 | 6 |
| 58 | 1653 | 57 | 6 |
| 59 | 1711 | 58 | 6 |
| 60 | 1770 | 59 | 6 |
| 61 | 1830 | 60 | 6 |
| 62 | 1891 | 61 | 6 |
| 63 | 1953 | 62 | 6 |
| 64 | 2016 | 63 | 6 |
| 65 | 2080 | 64 | 7 |
| 66 | 2145 | 65 | 7 |
| 67 | 2211 | 66 | 7 |
| 68 | 2278 | 67 | 7 |
| 69 | 2346 | 68 | 7 |
| 70 | 2415 | 69 | 7 |

FIG. 6.

METHOD AND APPARATUS FOR DETERMINING SHORT CIRCUIT CONDITIONS USING A GANG PROBE CIRCUIT TESTER

BACKGROUND OF THE INVENTION

FIELD OF THE INVENTION

This invention relates to electronic circuit testing, and more particularly to using a gang probe circuit tester to determine if short circuit conditions exist among a number of networks within a circuit under test.

BACKGROUND INFORMATION

The two basic types of electronic circuit testing employed today are gang probe circuit testing and flying probe circuit testing. With gang probe circuit testing a number of probes are held in simultaneous contact with a similar number of test points on the circuit under test as driving signals are applied to various probes, and as response signals are measured at various probes. With flying probe testing, a smaller number of probes, typically from one to four probes, are moved among, and into contact with, and the various test points for the application of test signals and the measurement of corresponding response signals.

A first conventional method for testing electronic circuits with gang probe testing involves the connection of two test points at a time, through a switching circuit connected to the various probes held in contact with the circuit under test, so that a test voltage is applied between these two test points. If these two test points are connected within the circuit under test, either by the deliberate design of the circuit under test or by an inadvertent connection, i.e. through a short circuit, current flows through the probes connected with these points.

This first conventional method for circuit testing is described, for example, in U.S. Pat. No. 4,471,298 to Frohlich, as being implemented within a circuit tester having a number of probes in a pair of contact bars simultaneously engaging test points. A circuit test is applied when two of these probes are electrically connected, by means of reed switches, to opposite sides of a power supply through a variable resistor. When current flows through the circuit under test between these test points, and hence through the variable resistor, a voltage developed across a portion of the variable resistor provides an indication that the test points are electrically connected, within the circuit under test, to a microprocessor controlling the test process. This method has a significant advantage of flexibility. Depending on the arrangement of test points, this method can be used both to determine both the presence of opens, or breaks in circuit patterns, and of shorts between adjacent circuit patterns. That is, a failure to conduct between two test points on an individual network indicates an open condition, while conduction between two networks indicates a short.

However, a particular problem with this first conventional method for circuit testing lies in the number of individual measurements which must be made to perform an exhaustive test of a reasonably complex circuit for short circuit conditions, and hence in the time required to perform circuit testing. For exhaustive testing, each pair of networks within the circuit under test must be separately evaluated, with a voltage being applied between the networks in the pair to determine if a current flow exists. For example, if the circuit under test includes 16 networks, a first side of the test circuit is connected through a first test point, while the second side of the test circuit is connected sequentially to the other 15 test points. Next, the first side of the circuit is connected through a second test point, while the second side of the test circuit is connected sequentially to 14 other test points. The number of test points to which the second side of the circuit is connected is reduced by one with each new connection of the first side of the circuit, since it is not necessary to retest pairs of points which have previously been tested. In general, the number of tests required, T, as a function of the number of networks to be tested, n, is given by:

$$T=(n-1)+(n-2)+ \ldots +[n-(n-1)] \quad\quad 1)$$

In the example of a circuit under test having 16 networks to be examined, this method requires 120 tests.

A second conventional method for determining whether short circuit conditions exist between individual networks of a circuit greatly reduces the number of tests which must be made. With this method, a first side of the test circuit is connected to a first test point of the circuit under test, while the second side of the test circuit is connected to the remaining test points. The application of a test voltage in this way produces a current flow, indicating a short circuit condition, if the network connected to the first test point is electrically connected to a network connected to any other test point. Next, the first side of the test circuit is connected to the second test point, while the second side of the test circuit is connected to the remaining test points, with the test being repeated to determine if a short circuit condition exists between the network connected to the second test point and a network connected to another test point. When the first side of the test circuit has been connected in this way to every test point except one, the testing has been completed, since each relationship between the network connected to the last test point and a network connected to another test point has already been examined. Thus, the number of tests required, T, as a function of the number of networks to be tested, n, is given by:

$$T=n-1 \quad\quad 2)$$

In the example of a circuit under test having 16 networks to be examined, this method requires 15 tests.

Despite the advantages of this second conventional method in the reduction of the number of tests required, for testing many modern types of circuits having hundreds or even thousands of networks which can be shorted, what is needed is a method further reducing the number of tests which must be made.

SUMMARY OF THE INVENTION

A first objective of the present invention is to provide a first method for rapidly determining whether a short circuit condition exists among two or more of the networks extending within a circuit under test.

A second objective of the present invention is to provide a second method to be used after it is determined, using the first method, that a short circuit condition exists, to determine which networks within a circuit under test are affected by the short circuit conditions.

A third objective of the present invention is to provide an alternative second method for determining which networks are short circuited to which other networks after it is determined, using the first method, that a short circuit condition exists.

A fourth objective of the present invention is to provide the first, second, and alternative second methods described above in a sequential fashion in the same test apparatus.

According to a first aspect of the invention, there is provided a method for determining the presence of short circuit conditions among a plurality of networks within a circuit under test, wherein the method comprises steps of:

a) bringing a first number of test probes into contact with the circuit under test, with the first number being greater than two, with each test probe within the first number thereof being in electrical contact with a network within the plurality thereof;

b) establishing electrical connections, in accordance with a predetermined connection pattern, between a drive line of a testing circuit and a first plurality of test probes, and between a sense line of the testing circuit and a second plurality of test probes, wherein the first and second pluralities of test probes are distinct from one another, wherein the first number of test probes is entirely comprised of the first and second pluralities thereof, with the testing circuit including a voltage source having a first side connected to the drive line and a second side connected to a current detector, with the current detector, additionally connected to the sense line, being responsive to current flowing therethrough;

c) determining whether current is flowing through the sense line; and d) repeating the steps b) and c), with the connection pattern being varied in a predetermined manner until each test probe within the first number thereof is connected to the drive line and the sense line in a unique sequence.

The speed of operation of this method results from the fact that test probes are switched to examine a plurality of test probes simultaneously for short circuit conditions. By contrast, the background art method described above as the second conventional method effectively examines a single test probe at a time for a short circuit condition.

In one version of the present invention, steps b) and c) above are performed a number of times equal to a base 2 logarithm of a second number, with the second number being a smallest power of two which is greater than or equal to the first number, i.e. to the number of probes being used. In this context, a power of two is taken to be a number equal to two raised to an integral power, such as 4, 8, 16, 32. Since this version determines whether a short circuit condition exists with a minimum number of tests, it is discussed in some detail below. However, the present invention is not considered to be limited to this version, as other switching sequences may be applied to examine a plurality of test probes simultaneously for short circuit conditions.

According to a second aspect of the present invention, there is provided a method for determining the presence of short circuit conditions among a plurality of networks within a circuit under test, wherein the method comprises steps of:

a) bringing a first number of test probes into contact with the circuit under test, with the first number being greater than two, with each test probe within the first number thereof being in electrical contact with a network within the plurality thereof;

b) applying a first test process to the circuit under test through the test probes to determine whether networks within the plurality thereof are electrically connected to one another by short circuit; and c) in the event that, within the step b), networks within the plurality thereof are determined to be electrically connected to one another by short circuit, applying a second test process to the circuit under test through the test probes to determine which networks within the plurality thereof are electrically connected to one another by short circuit.

BRIEF DESCRIPTION OF THE DRAWINGS

FIG. 2 is a tabular view of the sequence of operation of relays in a switching circuit having sixteen channels within the apparatus of FIG. 1;

FIG. 3 is a tabular view of the sequence of operation of relays in an alternate switching circuit having ten channels within the apparatus of FIG. 1;

FIG. 6 is a table comparing operation of test apparatus according to conventional methods and the method of the present invention;

DETAILED DESCRIPTION

Figure 1:
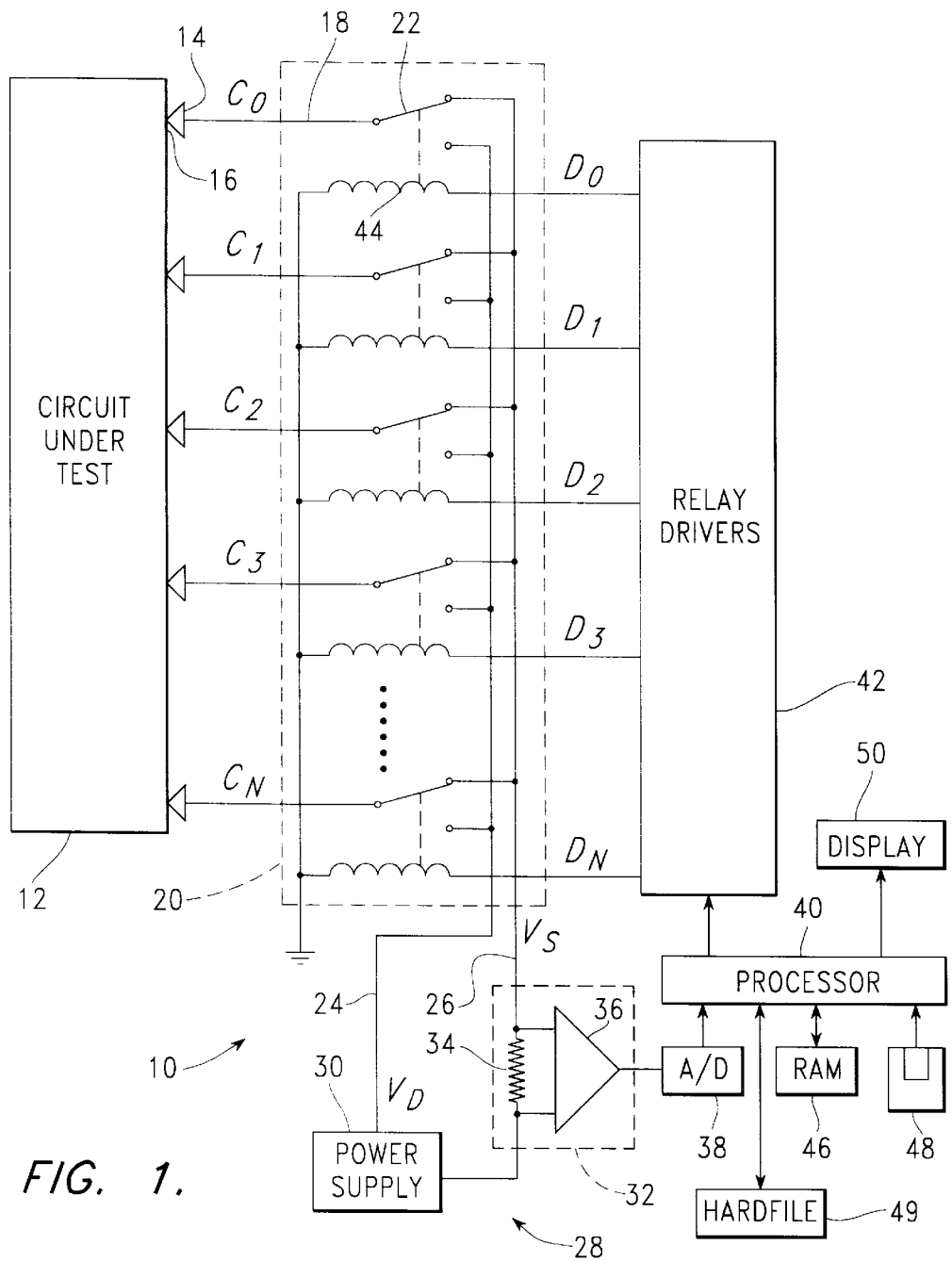
FIG. 1 is a schematic view of apparatus configured to perform circuit testing in accordance with the present invention.

FIG. 1 is a schematic view of test apparatus, generally indicated as 10, for applying tests to a circuit under test 12 in accordance with the present invention. This test apparatus 10 includes a number of individual probes 14, in a "gang probe" array individually in contact with test spots 16 on a surface of the circuit under test 12. Each probe 14 is connected to a channel 18 within a switching circuit 20. Each channel 18 includes a drive relay 22 connecting the associated probe 14 with either a drive line 24 or a sensing line 26.

The test apparatus 10 further includes a test circuit 28 having a power supply 30 connected to the drive line 24 and to a detector 32 which is provided with the sensing line 26 is an input. The detector 32 senses a flow of current between sensing line 26 and drive line 24, through power supply 30. The detector 32 includes, for example, a resistor 34 through which current flows between sense line 26 and power supply 30, and an amplifier 36 driven by a voltage drop across the resistor 34. The output of amplifier 36 provides an input to an analog-to-digital convertor 38, which in turn provides a digital input to a processor 40.

The processor 40 controls the testing process, providing inputs to relay drivers 42, which actuate coils 44 of drive relays 22 according to a pre-determined sequence provided by the processor 40. The processor 40 may be of a standard type, receiving instructions from a random access memory 46, executing a program read into the read-only memory 46 from a magnetic medium 48, and storing resulting test data in the read-only memory 46. The pre-determined sequence for operating drive relays 22 is preferably also held in the form of a relay sequence table in random access memory 46 during the execution of the circuit testing program within the processor 40. Program instructions, the relay sequence table, and other data may also be stored in a hardfile 48, for loading into the random access memory 49 when the processor 40 is turned on or when the circuit testing process is begun. The results of the testing process are displayed on a display screen 50, and may be used in other ways, such as the diversion of failing components into a scrap bin.

In the example of FIG. 1, a generalized number of channels, indicated by the letter "N" are available within switching circuit 20. Thus, while the signal from the first probe 14 is indicated as $C_0$, and the signal driving the corresponding first drive relay 22 is indicated as $D_0$, the signal from the last probe 14 is indicated as $C_N$, and the signal driving the corresponding last drive relay 22 is indicated as $D_N$.

FIG. 2 is a table indicating a preferred version of the sequential operation of the drive relays 22 within a switching circuit 20 having sixteen channels. The drive relays associated with these sixteen channels, numbered as channels "0" through "15," are switched as shown in four tests, numbered "1" through "4." In the body of the table of FIG. 2, a "0" indicates that electrical current is not driven through the coil 44 of an associated drive relay 22, and hence that the channel 18 is switched to sense line 26. On the other hand, a "1" indicates that electrical current is driven through the coil 44 of associated drive relay 22, so that the channel 18 is switched to drive line 24. For example, in the first test, channels "0" through "7" are electrically connected to sense line 26, while channels "8" through "15" are electrically connected to drive line 24.

Continuing to refer to FIGS. 1 and 2, to fulfill the requirement that any short circuit condition occurring between networks extending within the circuit under test 12 will be detected by the apparatus 10, the switching circuit 20 is operated in a way assuring that each channel is switched according to a unique sequence. If two channels were switched according to the same sequence, i.e. if they were simultaneously both connected to either drive line 24 or sense line 26, current would not flow through detector 32 in the presence of a short circuit between the channels, so such a fault would not be detected. Since the number of channels in this example is equal to the fourth power of 2, all of the sixteen sequences possible with four tests are used to provide different sequences for the sixteen channels. The order in which the tests are performed is not important. For example, test "4" can be performed first, being followed by the other three tests in any order. In each test, an equal number of channels 18 are switched to drive line 24 and sense line 26. In the example of FIG. 2, each channel is arbitrarily identified by a number derived from the indicated test sequence being applied as a binary number having the first test as the high order bit and the last test as the high order bit.

FIG. 3 is a table indicating a preferred version of the sequential operation of drive relays 22 within a switching circuit 20 having ten channels. Again, each channel has a unique switching sequence, with the switching sequences of FIG. 3 being a subset of the switching sequences of FIG. 2. If the method of FIG. 2 works for all sixteen channels, it must work for a subset of ten of these channels, and therefore for a switching circuit 20 having only ten channels.

On the other hand, a switching circuit having only eight channels requires only three tests to establish a unique switching sequence for each channel. For example, such a switching circuit may be driven according to the tests "2," "3," and "4" of FIG. 2, with the eight channels being those numbered "0" through "7."

In general, the number of channels, N, which can be switched in unique sequences in a number of tests, T, is given by:

$$N=2^T \qquad 3)$$

When the above equation is solved for T, the following expression is found:

$$T=\log_2(N) \qquad 4)$$

These equations are only meaningful for integral values of N and T; there must be an integral number of channels and an integral number of tests. These conditions are met only when the number of channels, N, is a power of 2, i.e. 2, 4, 8, 16 . . . If the number of channels to be switched is not a power of two, the number of tests required is determined by substituting the smallest power of two in which the number of channels is included into the above equation. Thus, in the example of FIG. 3, with ten channels to be switched, N is given a value of 16 in this equation, since 16 is the smallest power of two in which 10 is included.

While the process described above is adequate to determine whether a short circuit exists between any pair of networks in the circuit under test, it is not adequate to determine which particular pair of networks is connected by the short circuit thus detected. During the testing process, each test produces a single bit of information, indicating whether or not current flows through the detector 24 with the drive relays 22 switched into a particular configuration. In the nomenclature of the above equations, T tests are performed, resulting in T bits of information. The number of possible ways, N, in which the T bits can be configured is given above by Equation 3). However, the number of pairs of networks in a circuit under test having N networks is given by:

$$P=(n-1)+(n-2)+ \ldots +[n-(n-1)] \qquad 5)$$

In the example of FIG. 2, there are four tests, as required to determine the presence of a short circuit among sixteen networks within the circuit under test 12. These four tests produce four bits of information. However, the number of pairs which can exist within the circuit under test 12 is 120. Therefore, the data available from the test is inadequate to discriminate among the pairs, as needed to determine which pair is responsible for the short circuit which has been detected.

In many instances, such a determination is not needed. If short circuit conditions are relatively rare and random, it is probably sufficient to determine whether a short circuit exists, as any circuit having such a condition will simply be rejected. In other instances, it is desirable to determine which networks are shorted together, so that the circuit can be repaired, or so that a manufacturing process leading the short circuit condition can be corrected.

Continuing to refer to FIG. 1, therefore a version of the present invention provides an ability to determine which particular pair of networks in the circuit under test is connected by a short circuit. This ability is achieved without varying the apparatus shown in FIG. 1; through the use of a different sequence of operation for the drive relays 22. In this new sequence, a first drive relay 22 is operated to connect its associated first probe 14 with drive line 24, while the remaining drive relays 22 are not operated, so that their associated probes 14 are connected to sense line 26. With the drive relays 22 in this configuration, current flows through detector 32 when and only when the network of circuit under test 12 contacted by the first probe 14 is connected to another network through a short circuit. Next, the second drive relay 22 is operated to connect its associated second probe 14 with drive line 24, while the remaining drive relays, including the first drive relay, are connected to sense line 26. This process is continued, with a different test probe 18 being connected to drive line 24 while the remaining drive relays are connected to sense line 26. Whenever a flow of current is detected within detector 32, an indication is provided that the network contacted by the particular test probe 14 being connected to drive line 24 is connected to another network within the circuit under test 12 through a short circuit.

If a single short circuit is present within the circuit under test, the two networks through which it is connected are identified by current flow during this short circuit identification process. If two short circuits are present in the circuit under test, two, three, or four networks are identified by current flow during this process.

Continuing to refer to FIG. 1, each drive relay 22 is preferably a "break before make" type, in which, as the drive relay contact is transferred in either direction, the formerly connected circuit is broken before the other circuit is connected. With relays of this type, any current flowing through the detector 32 indicates the presence of a short circuit within circuit under test 12, even if this current flow occurs during the process of switching the drive relays 22 because one of these drive relays 22 transfers before another. Thus, if drive relays 22 are all of a "break before make" type, any output of analog to digital convertor 38 arising from a current flow through detector 32 during the testing process indicates a failure condition which causes processor 40 to indicate that the circuit under test 12 has a short circuit. This indication, which is presented on display device 50, may be accompanied by other actions initiated by processor, such as causing the circuit under test 12 to be removed from a flow of materials being processed.

It is understood by one skilled in the art that the relay technology shown in FIG. 1 can readily be replaced by reed switches or by well known electronic (transistor) switching techniques. If the "make before break" operation described above cannot be assured, timing conditions can be established within the operation of the device to assure that all of the switching devices have transferred as required before the output of detector 32 is sampled to determine whether a short circuit exists within the circuit under test 12.

Figure 4:
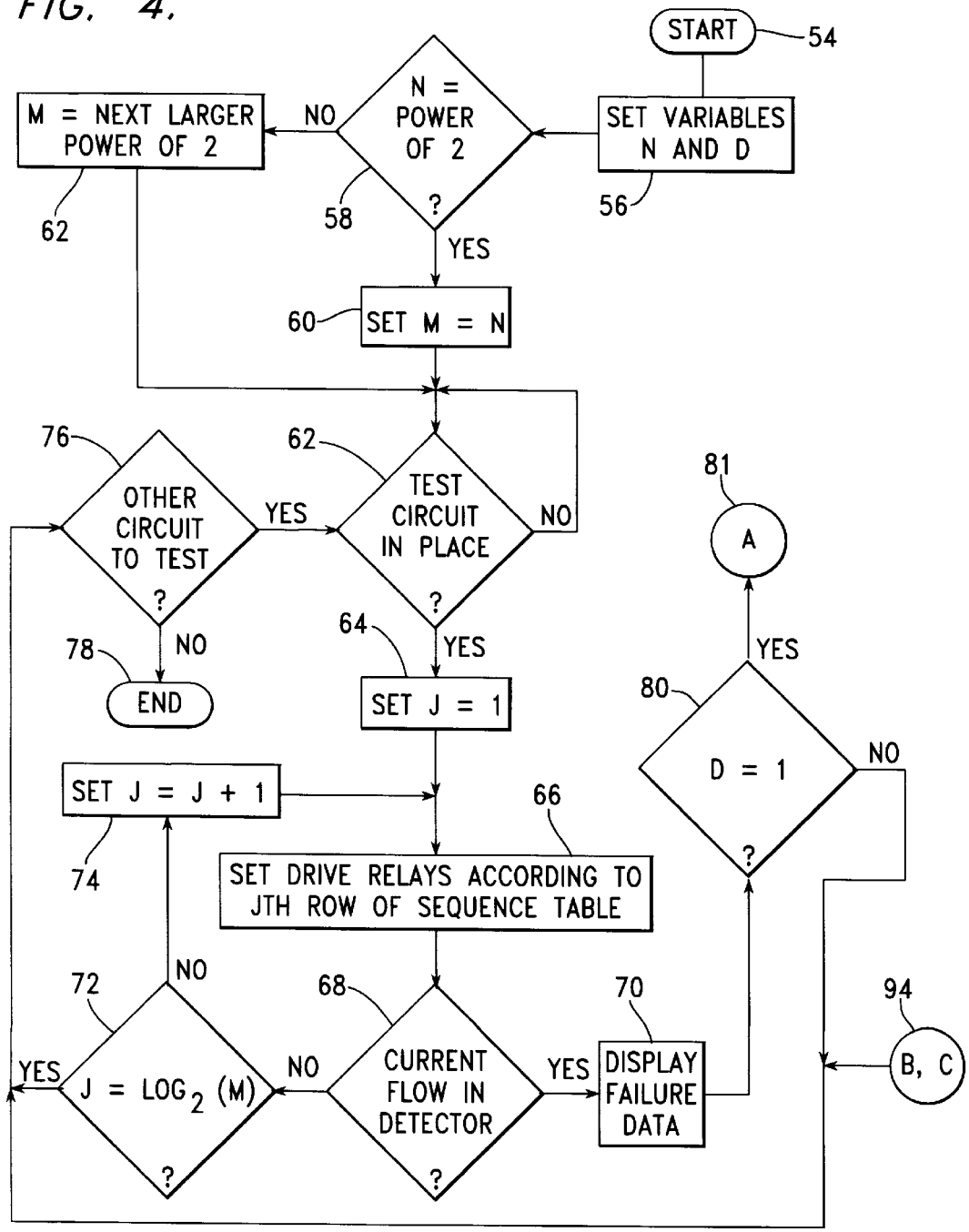
FIG. 4 is a flow chart showing operation of the apparatus of FIG. 1 during a first pass to determine whether short circuit conditions exist.

FIG. 4 is a flow chart describing operation of test apparatus built in accordance with the present invention during a first-pass operation to determine if short circuit conditions exist. This exemplary apparatus is provided with an operator-selectable feature determining which of the networks are connected to one or more other networks in the circuit under test 12 by means of a short circuit, and is particularly configured for testing a large number of similar circuits at a rapid rate.

Referring to FIGS. 1 and 4, the process of testing a number of samples of a particular type is begun in block 54, after the operator has provided the input data indicating the number of probes to be used and whether the additional tests necessary to determine which networks are connected to others by short circuits should be applied. In block 56, this data is used to set variables, with a variable "N" representing the number of probes 14 being used, and a variable "D" being set to zero if the additional tests are not selected and to one if they are selected. Next, in block 58, a determination is made of whether "N" is a power of two, such as 8, 16, 32, 64. If "N" is a power of two, in block 60, a new variable "M" is set to the value of "N." If "N" is not a power of two, "M" is set to the power of 2 which is next larger than "N" in block 62. For example, if N=33, M is set to 64. At this point, the test apparatus is ready to begin the examination of a number of circuits to be tested, which are generally of an identical type.

Next a determination is made, in block 62, of whether a circuit under test 12 is in place within the test apparatus. This data may be provided, for example, by means of switches (not shown) actuated by movement of the circuit under test 12. If the circuit under test 12 is in place, a counter variable "J" is set to 1 in block 64 to begin the testing process. Also at this time, mechanical processes may occur, such as the engagement of probes 14 with the surface of the circuit under test 12.

Next, a loop is entered in which the drive relays 22 are operated to provide the predetermined sequence of probe switching required by the testing process. During execution of this process, this sequence is stored in random access memory in the form of a sequence table. In each pass through block 66, the drive relays 22 are driven according to a row of this sequence table, with the particular row being determined by the value of the counter variable "J." Thus in the first pass through block 66, the drive relays 22 are set according to the first row of the sequence table, with "J" having been set to one in block 64. In block 68, a determination is made of whether current is flowing in detector 32. If such current is flowing, the circuit under test 12 has failed this part of the test, and a visual indication of this fact is provided in block 70. If such current is not flowing, the circuit under test 12 has passed the test to this point, so the testing is continued, with a determination being made in block 72 of whether the counter variable "J" has reached its maximum value required to generate sufficient relay sequences for the number of test probes 14 being used. If this maximum value has not been reached, the value of "J" is incrementally increased in block 74 so that the next row in the sequence table is used to determine the operation of drive relays 22.

If it is determined in block 72 that this maximum value of "J" has been reached, the circuit under test 12 has successfully completed this testing process. At this point, the circuit under test may be mechanically removed from the apparatus. Next, a determination is made in block 76 of whether there is another circuit remaining to be tested. If there is no such circuit remaining, the process is ended in block 78. If there is such a circuit remaining, the testing process is begun for the new circuit under test when it is determined, in block 62, to be in place within the apparatus.

After a test circuit failure is detected in block 68 and displayed in block 70, a determination is made in block 80 of whether the operator has indicated that the test circuit networks which are connected to one another by one or more short circuits need to be identified. If he has not made this indication, the value of variable "D" is zero, so the system proceeds to block 76. If he has indicated that this information is needed, the variable "D" is one, so the system proceeds to start the second pass in through point "A" in block 81.

Figure 5:
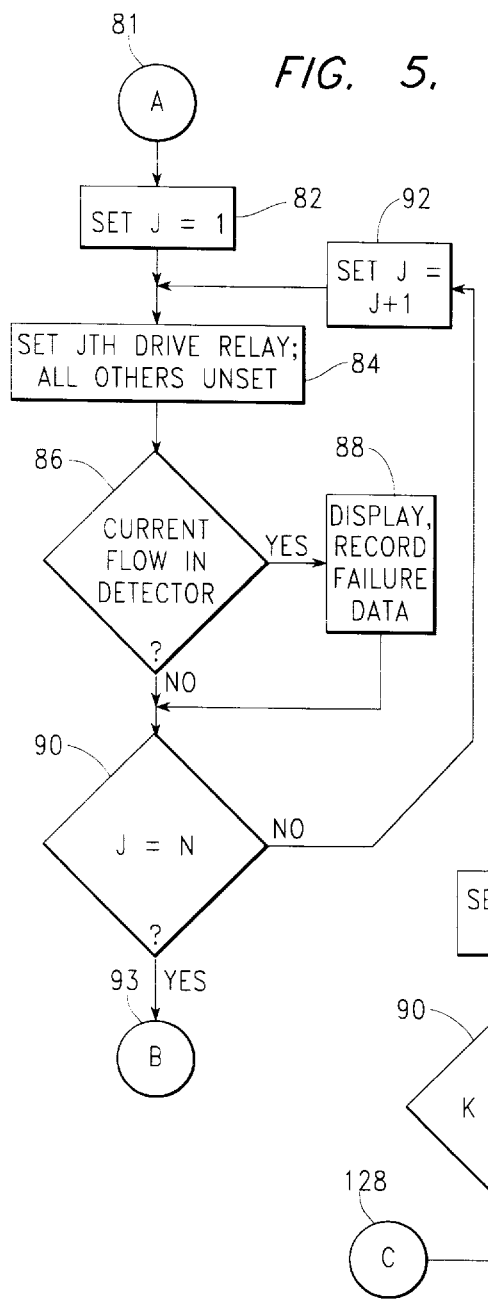
FIG. 5 is a flow chart showing operation of the apparatus of FIG. 1 during a second pass to determine which networks are involved in short circuit conditions.

FIG. 5 is a flow chart showing the operation of the apparatus 10 of FIG. 1 during a second pass operation to determine which networks within the circuit under test are involved in short circuit conditions. After this second pass is begun at point "A" in block 81, the counter variable "J" is again set to one in block 82. Next the system enters a loop in which the drive relays 22 are operated to provide a second sequence of probe switching. Within this loop, in block 84, a single drive relay, which is identified by the counter variable "J," is set to connect a single test probe 14 to the drive line 24. In the first pass, with "J" equal to one, the first test probe 14 is connected to the drive line 24. In each pass, the remaining probes 14 are connected to sense line 26. Next, in block 86, a determination is made of whether there is current flow in detector 32. Such current flow indicates the network connected to drive line 24 is also connected to one or more of the other networks within circuit under test 12 by means of one or more short circuits. Thus, if such current flow is detected, the failure of the network connected to drive line 24 is displayed in block 88 on display unit 50. An index, such as a number, representative of the Jth probe, may also be written to the processor memory 46 at this time for future use.

Operation of the system within this loop proceeds until each of the test probes 14 has been individually connected to drive line 24. Thus, in block 90, a determination is made of whether all of the probes 14 have been so connected. If they have not, the counter variable "J" is incremented in block 92, and the system returns to block 84. When all of the probes 14 have been individually connected to drive line 24, the second pass is ended at point "B" in block 93. From point "B," the system returns to the flow chart of FIG. 4, entering this pattern at point "B" in block 94 and proceeding proceeds to block 76, where a determination is made of whether there is another circuit to test.

While the above discussion indicates that a single probe 14 is connected to drive line 24, while the remaining probes 14 are connected together to sense line 26, the single probe 14 may alternately be connected to sense line 26, while the remaining probes 14 are connected together to drive line 24.

While the above discussion indicates that the system moves to block 80 upon detection of current flow in block 68, the first testing process looping through block 66 may alternately be continued until its conclusion, as indicated by block 72, even in the presence of a detection of current flow.

Referring to FIGS. 1, 2, and 3, a key to the switching method of the present invention is that the sequence in which a channel is switched among the various tests is different for each of the channels being tested. This means that, for any pair of channels, there must be at least one of the tests in which the channels differ, with one channel being connected to the drive line 24 while the other channel is connected to the sense line 26. In such a test, a short circuit between the two channels of the pair results in the measurement of a current flow, indicating a circuit failure.

FIG. 6 is a table showing the particular advantages of the present method compared to the first and second conventional methods described above in the "Background Information" section. This chart describes the number of tests required to determine the presence of a short circuit in a circuit under test having from 1 to 70 channels, by each of three methods. Method 1 is the method described as the first conventional method, in which individual pairs of networks are examined. Method 2 is the method described as the second conventional method, in which each single probe, except for the last probe, is connected to one side of the test circuit while the other probes are simultaneously connected to the other side of the test circuit. Method 3 is the preferred method of the present invention, with the number of tests being limited according to the base 2 logarithm of a number which is the smallest power of two greater than or equal to the number of channels.

Figure 7:
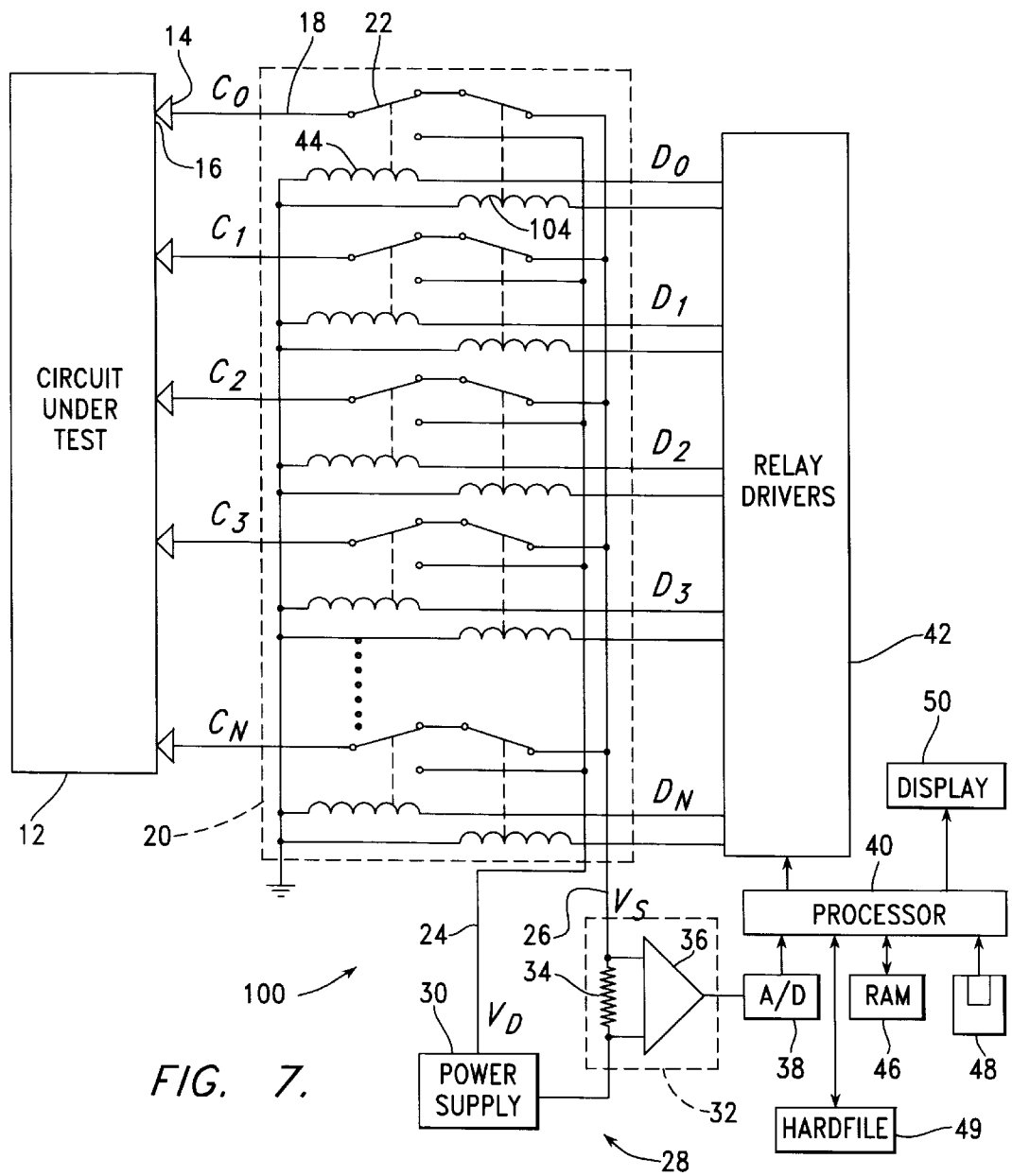
FIG. 7 is a schematic view of a first alternative version of apparatus configured to perform circuit testing in accordance with the present invention.

FIG. 7 is a schematic view of a first alternative version 100 of apparatus built in accordance with the present invention to perform circuit testing. While the apparatus 10 of FIG. 1 is able to determine, during a second pass, which networks are involved in short circuit condition, the first alternative version 100 is additionally able to determine which networks are connected to which other networks by short circuits. The alternative version 100 includes a number of elements which are similar to corresponding elements in the apparatus 10 of FIG. 1 and which are therefore accorded line reference numerals. Additional information is obtained through the use, in alternative version 100, of a sense relay 102 having a single contact which can close and open the circuit extending between an associated drive relay 22 and the current detector 32. Each sense relay 102 includes a coil 104 operated by a relay driver within the relay drivers 42.

The operation of the first alternative version 100 of apparatus during a first pass occurs as described above in reference to FIG. 4, with the contacts of each of the sense relays 102 held closed. As described above, this first pass determines whether any networks within the circuit 12 under test are connected to one another through one or more short circuits. If a determination has been made that it is not necessary to perform further testing on this circuit 12, it is rejected, with failure data being displayed in block 70 of FIG. 4.

Figure 8:
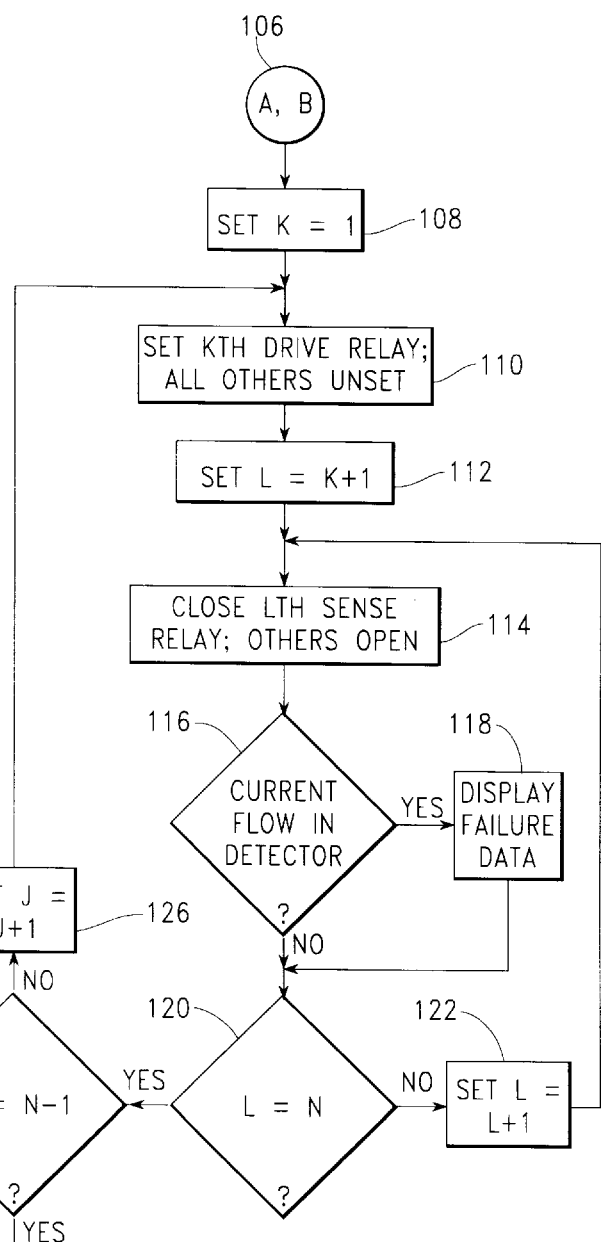
FIG. 8 is a flow chart showing operation of the apparatus of FIG. 7 during a second pass to determine which networks are connected to which other networks.

FIG. 8 is a flow chart showing the operation of the first alternative version 100 of FIG. 7 during a second pass, after a determination has been made in block 80 of FIG. 4 that further testing of the circuit 12 is required. This second pass is entered at point "A" in block 106. Next, the counter variable "K" is set to one in block 108. Then the system enters a loop in which the relays 22 are operated to provide a second sequence of probe switching. During each pass through this first loop, a single drive relay 22, identified herein by the counter variable "K," is set to connect a single test probe 14 with the drive line 24, while the remaining test probes, identified by counter variables having values from "K+1" through "N," are sequentially connected, one at a time, to the current detector 32 by means of associated sense relays 104. Thus, in block 110, the Kth drive relay 22 is set, with the other drive relays 22 being unset, so that they are individually connected to associated sense relays 104. Next, in block 112, a second counter variable "L" is set to "K+1," before entering a loop beginning with block 114, in which the Lth sense relay 104 is closed, with other sense relays 104 being open.

Thus, the Kth drive relay 22 connects the Kth test probe 14 to the drive line 24, while the Lth test probe 14 is connected to current sensor 32 through the Lth drive relay 22 and the Lth sense relay 104, and while connections to the remaining test probes 14 within the switching circuit 20 are opened. Under these conditions, current flowing through the current detector 32 indicates that a short circuit exists between the network within circuit 12 contacted by the Kth and Lth test probes 14. Also under these conditions, a lack of current flowing through the current detector 32 indicates that a short circuit does not exist between the networks contacted by the Jth and Kth test probes 14. Therefore, when a determination is made in block 116 that current is flowing through the detector 32, an indication of a short circuit between the networks connected by the Kth and Lth test probes is displayed through indicia representative of these probes in block 118.

Whether or not current flows within the detector 32, a determination is next made in block 120 of whether the variable "L" has reached the last (Nth) value. If it has not, the next value for the variable "L" is assigned in block 122, with the system then returning to block 114. If the variable "L" has reached N, the last value, a determination is made in block 124 of whether the variable "K" has reached the last value. If it has not, the next value for this variable "K" is assigned in block 126, with the system then returning to block 110. If "K" has reached its next to last value, N−1, the second pass is ended at point "C" in block 128. The counter "K" is not driven to the last value "N," since there would be no other channel, having a value K+1 with which to test. From point "C," in block 128, the system returns to point "C" in block 94 of FIG. 4, and from there to block 76 of FIG. 4, where a determination is made of whether there is another circuit 12 to test.

The application of the process of FIG. 8 results in an exhaustive method for examining all networks to determine which are connected by short circuits. This method is acceptable when short circuits are relatively rare, since the process of determining whether they are present has been facilitated through operation of the apparatus in accordance with the process of FIG. 4, or when there are relatively few networks to test within each circuit 12 under test. If short circuits are relatively commonplace, and if there are a relatively large number of networks to test within each circuit 12 under test, an alternative method is preferably used, with a second pass, similar to that of FIG. 5, to determine which circuits are involved in short circuits, being followed by a third pass, similar to that of FIG. 8, to determine which circuits, among those identified during the second pass, are connected by short circuits to which other circuits, also identified during the second pass.

Referring again to FIG. 5, in the second pass of this alternative method, whenever it is determined in block 86 that current if flowing in the detector 32, a line is written in a failure table within data storage 46, indicating the number, "J" of the drive relay 22 which is currently set. Thus by the end of this second pass, the failure table includes an entry with a value indicating each probe 14 through which a current was detected, indicating the involvement of a corresponding network within the circuit 12 under test in a short circuit condition. When this second pass is completed at point "B" in block 93, a third pass is started at point B in block 106 of FIG. 8.

Referring again to FIG. 8, in the third pass of this alternative method, the counter variable "K" determines a line in the failure table previously written in block 88, with K=1 eliciting the first line, etc., through the Nth, or last, line in the table. Thus, the Kth drive relay, which is set in block 110, is the relay associated with the Kth line of the failure table. For each line "K" of the failure table, up to the last such line, the next line is K+1, to which L is set in block 112. Using this method, the third pass tests only those channels which have been identified in the second pass as being connected to other channels by short circuits within the circuit 12 under test.

Figure 9:
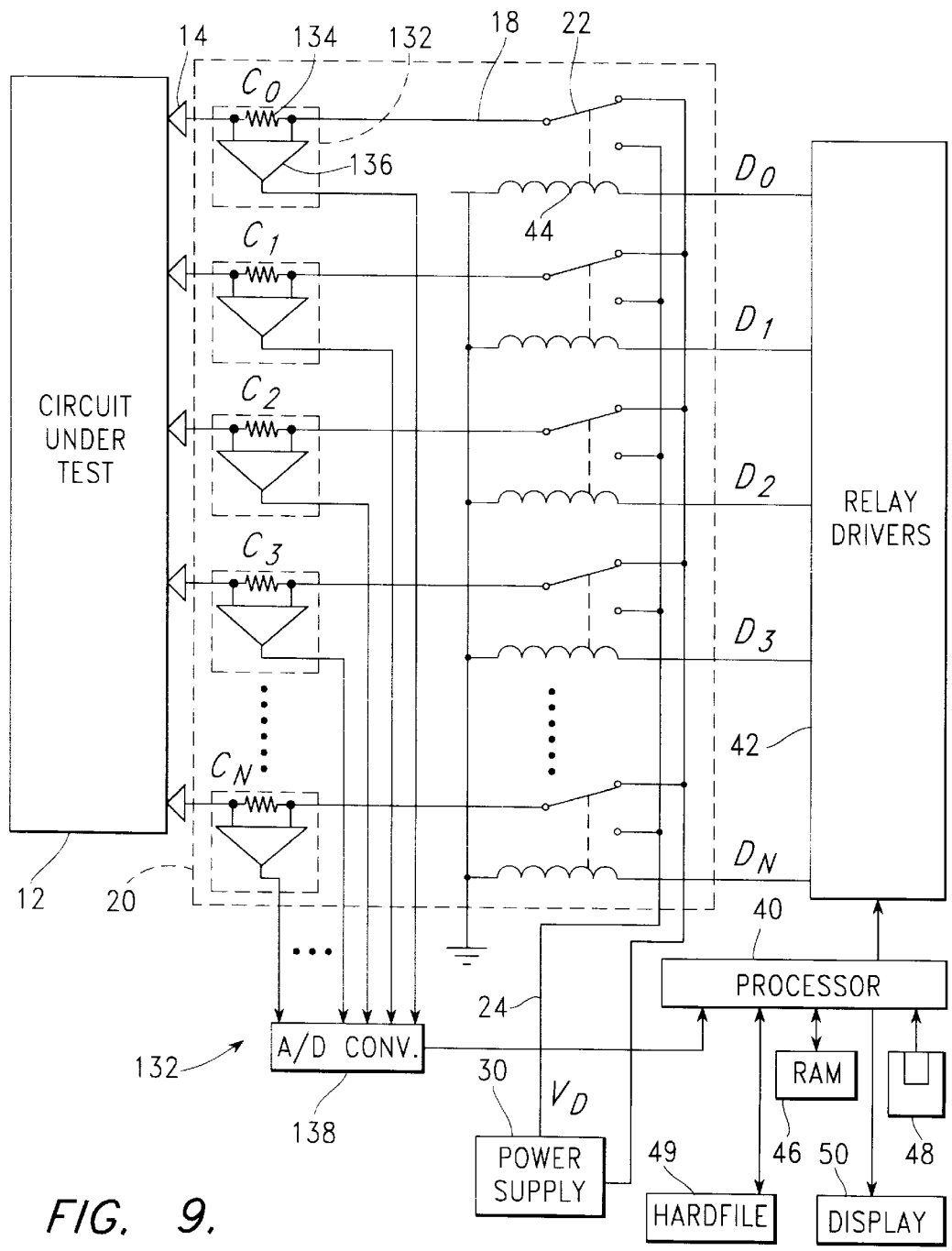
FIG. 9 is a schematic view of a second alternative version of apparatus configured to perform circuit testing in accordance with the present invention.

FIG. 9 is a schematic view of a second alternative version 130 of apparatus built in accordance with the present invention. This version 130 is similar to the apparatus 10 which has been described above in reference to FIG. 1, except that the single current detector 32 of the apparatus 10 has been replaced in alternative version 130 with a current detector 132 in each channel of the switching circuit 20. Each current detector 32 includes a resistor 134 and an amplifier 136, which drives an input to an analog-to-digital convertor 138. The analog-to-digital convertor 138 produces multi-bit digital output in accordance with the combination of current detectors 132 which detect a flow of current. For example, a digital code is formed within the convertor 138 having a single bit corresponding to each of the current detectors 132, with this bit being given a "zero" value when a current flow is not detected within the corresponding detector 132 and a "one" value when a current flow is detected therein. The output of this convertor 138 is provided in a serial or parallel manner as an input to the processor 40.

The second alternative version 130 of test apparatus, shown in FIG. 9 is operated as described above in reference to FIGS. 4 and 5. In block 68 of FIG. 4, each of the bits in the output of analog-to-digital convertor 138 is checked to determine of there is any current flow. Any such current flow indicates the presence of a short circuit. In block 86 of FIG. 5, when a Jth relay has been set to connect the Jth probe 14 to drive line 24, a flow or current through another probe 14, as indicated by a corresponding bit in the output of the analog-to-digital convertor 138, indicates that there is a short circuit within the circuit 12 under test between the network contacted by the Jth probe 14 and the network contacted by this other probe 14. A flow of current through two or more probes 14, other than the Jth probe, as indicated by two or more corresponding bits in the output of the convertor 138, indicates that these two or more corresponding networks are connected to the network contacted by the Jth probe. In any case, when such current flow is detected, it is displayed in block 88.

While the invention has been described in terms of exemplary embodiments, it is contemplated that it may be practiced as outlined above with modifications within the scope of the appended claims.

What is claimed is:

1. A method for determining the presence of short circuit conditions among a plurality of networks within a circuit under test, wherein said method comprises steps of:

a) bringing a first number of test probes into contact with said circuit under test, with said first number being greater than two, with each test probe within said first number thereof being in electrical contact with a network within said plurality thereof;

b) establishing electrical connections, in accordance with a predetermined connection pattern, between a drive line of a testing circuit and a first plurality of test probes, and between a sense line of said testing circuit and a second plurality of test probes, wherein said first and second pluralities of test probes are distinct from one another, wherein said first number of test probes is entirely comprised of said first and second pluralities thereof, with said testing circuit including a voltage source having a first side connected to said drive line and a second side connected to a current detector, with said current detector, additionally connected to said sense line, being responsive to current flowing therethrough, and wherein each test probe within said first number of test probes is electrically connected to a transfer contact transferred between a drive contact, electrically connected to said drive line and a sense contact, electrically connected to said sense line;

c) determining whether current is flowing through said sense line; and d) repeating said steps b) and c), with said connection pattern being varied in a predetermined manner until, within each pair of test probes within said first number thereof, a first test probe is electrically connected to said drive line while a second test probe is electrically connected to said sense line.

2. A method for determining the presence of short circuit conditions among a plurality of networks within a circuit under test, wherein said method comprises steps of:

a) bringing a first number of test probes into contact with said circuit under test, with said first number being greater than two, with each test probe within said first number thereof being in electrical contact with a network within said plurality thereof;

b) establishing electrical connections, in accordance with a predetermined connection pattern, between a drive line of a testing circuit and a first plurality of test probes, and between a sense line of said testing circuit and a second plurality of test probes, wherein said first and second pluralities of test probes are distinct from one another, wherein said first number of test probes is entirely comprised of said first and second pluralities thereof, with said testing circuit including a voltage source having a first side connected to said drive line and a second side connected to a current detector, with said current detector, additionally connected to said sense line, being responsive to current flowing therethrough;

c) determining whether current is flowing through said sense line;

d) repeating said steps b) and c), with said connection pattern being varied in a predetermined manner until, within each pair of test probes within said first number thereof, a first test probe is electrically connected to said drive line while a second test probe is electrically connected to said sense line;

e) after a current flow is detected within said step c), following step d) by establishing an electrical connection between an individual test probe within said first number thereof and said drive line, and between all other test probes within said first number thereof and said sense line;

f) determining whether current is flowing through said sense line;

g) recording an index, describing said individual test probe connected to said drive line when current is flowing through said sense line, in a first table; and h) repeating said steps e), f), and g) with another test probe within said first number thereof being connected to said drive line, and with all other test probes within said first number thereof being connected to said sense line, until each test probe within said plurality thereof has been thereby connected to said drive line.

3. The method of claim 2, wherein each said index recorded in step g) is displayed as an indication of a network within said circuit under test having a short circuit connection.

4. A method for determining the presence of short circuit conditions among a plurality of networks within a circuit under test, wherein said method comprises steps of:

a) bringing a first number of test probes into contact with said circuit under test, with said first number being greater than two, with each test probe within said first number thereof being in electrical contact with a network within said plurality thereof;

b) applying a first test process to said circuit under test through said test probes to determine whether networks within said plurality thereof are electrically connected to one another by short circuit, wherein said first test process includes connection of a first plurality of said test probes to a drive line through which a voltage is applied thereto and the simultaneous connection of a second plurality of said test probes to a sense line, with a flow of current through said sense line being detected, and wherein each test probe within said first number of test probes is electrically connected to a transfer contact transferred between a drive contact, electrically connected to said drive line, and a sense contact, electrically connected to said sense line; and c) in the event that, within said step b), networks within said plurality thereof are determined to be electrically connected to one another by short circuit, applying a second test process to said circuit under test through said test probes to determine which networks within said plurality thereof are electrically connected to one another by short circuit.

5. The method of claim 4, wherein said step c) includes the sequential application of a drive voltage to individual test probes and the simultaneous detection of current flow through other test probes to determine which networks within said plurality thereof are electrically connected to which other networks within said plurality thereof by short circuits.

6. A method for determining the presence of short circuit conditions among a plurality of networks within a circuit under test, wherein said method comprises steps of:

a) bringing a first number of test probes into contact with said circuit under test, with said first number being greater than two, with each test probe within said first number thereof being in electrical contact with a network within said plurality thereof;

b) establishing electrical connections, in accordance with a predetermined connection pattern, between a drive line of a testing circuit and a first plurality of test probes, and between a sense line of said testing circuit and a second plurality of test probes, wherein said first and second pluralities of test probes are distinct from one another, wherein said first number of test probes is entirely comprised of said first and second pluralities thereof, with said testing circuit including a voltage source having a first side connected to said drive line and a second side connected to a current detector, with said current detector, additionally connected to said sense line, being responsive to current flowing therethrough;

c) determining whether current is flowing through said sense line;

d) repeating said steps b) and c), with said connection pattern being varied in a predetermined manner until, within each pair of test probes within said first number thereof, a first test probe is electrically connected to said drive line while a second test probe is electrically connected to said sense line; and e) after a current flow is detected within said step c), following step d) by connecting each said test probe sequentially with said drive line, with all other test probes being connected to said sense line, with a flow of current through each test probe connected to said sense line being detected, and with an index representing said test probe connected to said drive line and each test probe connected to said sense line through which current is detected being displayed as representing corresponding networks connected by a short circuit.

7. A method for determining the presence of short circuit conditions among a plurality of networks within a circuit under test, wherein said method comprises steps of:

a) bringing a first number of test probes into contact with said circuit under test, with said first number being greater than two, with each test probe within said first number thereof being in electrical contact with a network within said plurality thereof;

b) establishing electrical connections, in accordance with a predetermined connection pattern, between a drive line of a testing circuit and a first plurality of test probes, and between a sense line of said testing circuit and a second plurality of test probes, wherein said first and second pluralities of test probes are distinct from one another, wherein said first number of test probes is entirely comprised of said first and second pluralities thereof, with said testing circuit including a voltage source having a first side connected to said drive line and a second side connected to a current detector, with said current detector, additionally connected to said sense line, being responsive to current flowing therethrough;

c) determining whether current is flowing through said sense line;

d) repeating said steps b) and c), with said connection pattern being varied in a predetermined manner until, within each pair of test probes within said first number thereof, a first test probe is electrically connected to said drive line while a second test probe is electrically connected to said sense line;

e) after a current flow is detected within said step c), following step d) by establishing an electrical connection between an individual test probe within said first number thereof and said sense line, and between all other test probes within said first number thereof and said drive line;

f) determining whether current is flowing through said sense line; and g) repeating said steps e) and f) with another test probe within said first number thereof being connected to said sense line, and with all other test probes within said first number thereof being connected to said drive line, until each test probe within said plurality thereof has been thereby connected to said sense line.

8. The method of claim 7, wherein an index describing each of said test probes connected to said sense line when current is discovered to be flowing therethrough in said step f) is displayed as an indication of a network within said circuit under test having a short circuit connection.

9. The method of claim 1, wherein said steps b) and c) are performed a number of times equal to a base 2 logarithm of a second number, with said second number being a smallest power of two which is at least equal to said first number.

10. A method for determining the presence of short circuit conditions among a plurality of networks within a circuit under test, wherein said method comprises steps of:

a) bringing a first number of test probes into contact with said circuit under test, with said first number being greater than two, with each test probe within said first number thereof being in electrical contact with a network within said plurality thereof;

b) establishing electrical connections between test probes in said first number thereof and drive and sense lines of a test circuit according to a predetermined connection pattern, with a second number of test probes within said plurality thereof being connected with said drive line and with all remaining test probes within said first number thereof being connected with said sense line, with said test circuit including a voltage source having a first side connected to said drive line and a second side connected to a current detector, with said current detector, connected additionally to said sense line, being responsive to current flowing therethrough, and with each test probe within said first number of test probes being electrically connected to a transfer contact transferred between a drive contact, electrically connected to said drive line, and a sense contact, electrically connected to said sense line;

c) determining whether current is flowing through said sense line; and d) repeating said steps b) and c), with said connection pattern being varied in a predetermined manner until said steps b) and c) have been performed a number of times equal to a base 2 logarithm of a second number, with said second number being a smallest power of two which is at least equal to said first number, and with each test probe in said plurality thereof being connected in said step b) in an individual sequence differing from other sequences in which other test probes in said plurality thereof are connected in said step b).

11. The method of claim 10, wherein said first number is equal to a power of two, and said second number is equal to half of said first number.

12. The method of claim 10, wherein said step c) further includes displaying test data indicating if current flows in sense line.

13. The method of claim 10, wherein said connection pattern is varied by switching each test probe within said plurality thereof between said test line and said sense line using a relay which breaks a first circuit before making a second circuit.

14. The method of claim 10, wherein said step c) is delayed after said step b) to allow variation of said connection pattern to be completed.

15. The method of claim 10, wherein, after a current flow is detected within said step c) said step d) is followed by additional steps of:

e) establishing an electrical connection between an individual test probe within said first number thereof and said drive line, and between all other test probes within said first number thereof and said sense line;

f) determining whether current is flowing through said sense line; and g) repeating said steps e) and f) with another test probe within said first number thereof being connected to said drive line, and with all other test probes within said first number thereof being connected to said sense line, until each test probe within said plurality thereof has been thereby connected to said drive line, h) displaying an index describing each of said test probes connected to said drive line when current is discovered to be flowing through said sense line in said step f) as an indication of a network within said circuit under test having a short circuit connection.

16. The method of claim 4, wherein said first test process comprises the sequential application of a first testing process to said circuit under test through varying pluralities of said test probes; and said second test process comprises the sequential application of a second testing process to said circuit under test through individual said test probes.

17. The method of claim 4, wherein said first test process comprises steps of:

d) establishing electrical connections, in accordance with a predetermined connection pattern, between a drive line of a testing circuit and a first plurality of test probes, and between a sense line of said testing circuit and a second plurality of test probes, wherein said first and second pluralities of test probes are distinct from one another, wherein said first number of test probes is entirely comprised of said first and second pluralities thereof, with said testing circuit including a voltage source having a first side connected to said drive line and a second side connected to a current detector, with said current detector, additionally connected to said sense line, being responsive to current flowing therethrough;

e) determining whether current is flowing through said sense line; and f) repeating said steps d) and e), with said connection pattern being varied in a predetermined manner until each test probe within said first number thereof is connected to said drive line and said sense line in a unique sequence.

18. The method of said claim 17, wherein said steps d) and e) are performed a number of times equal to a base 2 logarithm of a second number, with said second number being a smallest power of two which is at least equal to said first number.

19. A method for determining the presence of short circuit conditions among a plurality of networks within a circuit under test, wherein said method comprises steps of:

a) bringing a first number of test probes into contact with said circuit under test, with said first number being greater than two, with each test probe within said first number thereof being in electrical contact with a network within said plurality thereof;

b) establishing electrical connections between test probes in said first number thereof and drive and sense lines of a test circuit according to a predetermined connection pattern, with a second number of test probes within said plurality thereof being connected with said drive line and with all remaining test probes within said first number thereof being connected with said sense line, with said test circuit including a voltage source having a first side connected to said drive line and a second side connected to a current detector, with said current detector, connected additionally to said sense line, being responsive to current flowing therethrough;

c) determining whether current is flowing through said sense line;

d) repeating said steps b) and c), with said connection pattern being varied in a predetermined manner until said steps b) and c) have been performed a number of times equal to a base 2 logarithm of a second number, with said third number being a smallest power of two which is at least equal to said first number, and with each test probe in said plurality thereof being connected in said step b) in an individual sequence differing from other sequences in which other test probes in said plurality thereof are connected in said step b);

e) following a determination in said step c) that current is flowing through said sense line, establishing an electrical connection between an individual test probe within said first number thereof and said sense line, and between all other test probes within said first number thereof and said drive line;

f) determining whether current is flowing through said sense line;

g) repeating said steps e) and f) with another test probe within said first number thereof being connected to said sense line, and with all other test probes within said first number thereof being connected to said drive line, until each test probe within said plurality thereof has been thereby connected to said sense line and h) displaying an index describing each of said test probes connected to said sense line when current is discovered to be flowing therethrough in said step f) as an indication of a network within said circuit under test having a short circuit connection.

20. The method of claim 4, wherein said second test process comprises steps of:

d) establishing an electrical connection between an individual test probe within said first number thereof and a first testing circuit line, and between all other test probes within said first number thereof and a second testing circuit line, wherein said first and second testing circuit lines extend to a testing circuit including a voltage source and a current detector;

e) determining whether current is flowing through said testing circuit; and f) repeating said steps d) and e) with another test probe within said first number thereof being connected to said first testing circuit line, and with all other test probes within said first number thereof being connected to said second testing circuit line, until each test probe within said plurality thereof has been thereby connected to said first testing circuit line.

21. Apparatus for determining the presence of short circuit conditions among a plurality of networks within a circuit under test, wherein said apparatus comprises:

a first number of test probes, in contact with said circuit under test and in alignment with said networks within said plurality thereof so that each test probe within said first number thereof contacts an individual network within said plurality thereof, with said first number being greater than two;

a testing circuit including a voltage source having a first side connected to a drive line and a second side connected to a current detector, with said current detector, additionally connected to a sense line, being responsive to current flowing therethrough;

a switching circuit including first switching means connected to each test probe within said first number thereof, connecting said test probe with said drive line in a first switch position and with said sense line in a second switch position; and;

sequencing means operating said switching circuit according to a first predetermined sequence of connection patterns, with each connection pattern within said first predetermined sequence causing a first plurality of test probes within said first number thereof to be connected to said drive line while a second plurality of test probes within said first number thereof is connected to said sense line, wherein said first and second pluralities of test probes are distinct from one another, wherein said first number of test probes is entirely comprised of said first and second pluralities thereof, and wherein differing connection patterns within said first predetermined sequence are sequentially applied until, within each pair of test probes within said first number thereof, a first test probe is electrically connected to said drive line while a second test probe is electrically connected to said sense line.

22. The apparatus of claim 21, wherein, in response to detection of current in said current detector as said switching circuit is operated according to said first predetermined sequence of connection patterns, said sequencing means additionally operates said switching circuit according to a second predetermined sequence of connection patterns, with each connection pattern within said second predetermined sequence causing an individual probe within said first number thereof to be connected to said drive line, while all remaining probes within said first number thereof are connected to said sense line, and wherein differing connection patterns within said second predetermined sequence are sequentially applied as differing test probes are connected to said until each test probe within said first number thereof, except for a single, last test probe within said first number thereof, is connected to said drive line.

23. The apparatus of claim 22, additionally comprising display means indicating failure locations by displaying indicia corresponding to said test probes connected to said drive line as said switching circuit is operated according to said second predetermined sequence of connection patterns and as current flow is detected in said current detector.

24. The apparatus of claim 21, wherein, in response to detection of current in said current detector as said switching circuit is operated according to said first predetermined sequence of connection patterns, said sequencing means additionally operates said switching circuit according to a second predetermined sequence of connection patterns, with each connection pattern within said second predetermined sequence causing an individual probe within said first number thereof to be connected to said sense line, while all remaining probes within said first number thereof are connected to said drive line, and wherein differing connection patterns within said second predetermined sequence are sequentially applied as differing test probes are connected to said sense line until each test probe within said first number thereof is connected to said sense line.

25. The apparatus of claim 24, additionally comprising display means indicating failure locations by displaying indicia corresponding to said test probes connected to said sense line as said switching circuit is operated according to said second predetermined sequence of connection patterns and as current flow is detected in said current detector.

26. The apparatus of claim 21, wherein said first switching means includes a relay which breaks a first circuit before making a second circuit.

* * * * *